United States Patent [19]

Dean et al.

[11] 4,309,808

[45] Jan. 12, 1982

[54] LEAD CUT AND OUTWARD CLINCH MECHANISM

[75] Inventors: Weibley J. Dean, Hillcrest; Robert H. Holmes; Phillip A. Ragard, both of Binghamton, all of N.Y.

[73] Assignee: Universal Instruments Corporation, Binghamton, N.Y.

[21] Appl. No.: 109,874

[22] Filed: Jan. 7, 1980

[51] Int. Cl.³ .................... B23Q 41/00; H05K 13/04; B21F 11/00

[52] U.S. Cl. ................... 29/566.3; 29/566.1; 29/715; 29/739; 140/93 D; 140/105

[58] Field of Search .................... 29/566.3, 715, 739, 29/566.1; 140/105, 93 D

[56] References Cited

U.S. PATENT DOCUMENTS

| | | | |
|---|---|---|---|
| 2,902,689 | 9/1959 | Peterson | 29/566.3 |
| 3,724,055 | 4/1973 | Holmes et al. | 29/739 X |
| 3,740,817 | 6/1973 | Weller et al. | 29/739 X |
| 4,087,034 | 5/1978 | Kikkawa | 29/566.1 |
| 4,151,637 | 5/1979 | Zemek et al. | 29/715 X |
| 4,153,082 | 5/1979 | Foley | 140/93 D X |
| 4,165,557 | 8/1979 | Taguchi | 29/715 X |

FOREIGN PATENT DOCUMENTS 7713779  6/1978  Netherlands ................ 140/105

*Primary Examiner*—William R. Briggs
*Attorney, Agent, or Firm*—Fidelman, Wolffe & Waldron

[57] ABSTRACT

An electronic component lead cutting and outwardly clinching mechanism for cutting the component leads that extend from the underside of a printed circuit board and for outwardly clinching the portions of the leads remaining after the cutting to the underside of the printed circuit board. The severed scrap portions of the leads fall into a scrap discharge chute to be carried away from the cutting and clinching mechanism. A lead detector is incorporated into the mechanism to detect the presence or absence of the leads during the shearing action.

7 Claims, 6 Drawing Figures

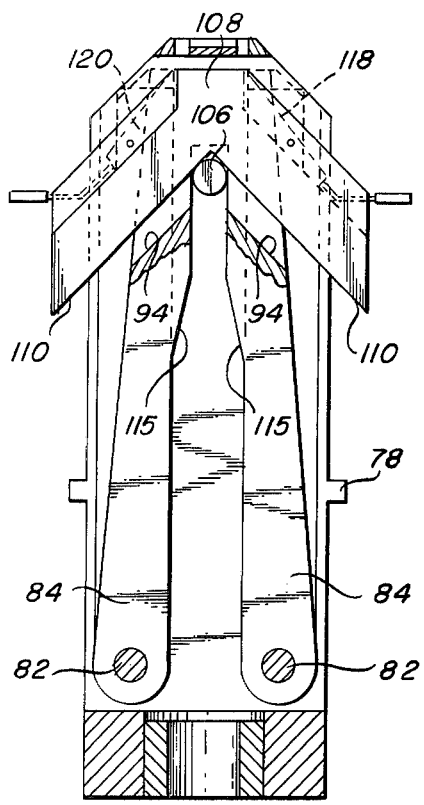
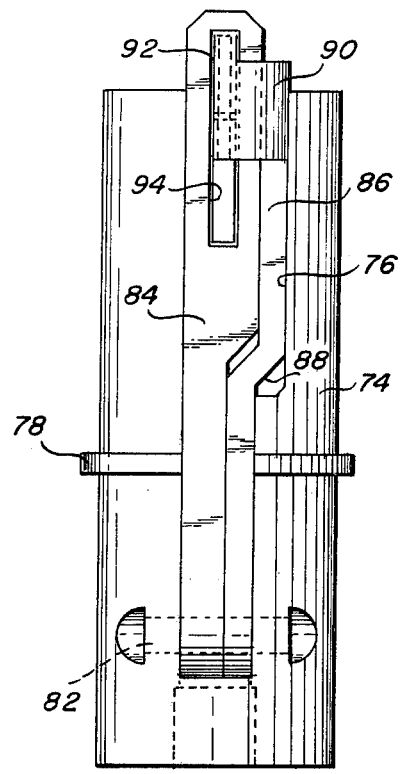
Fig. 4    Fig. 5
Fig. 6
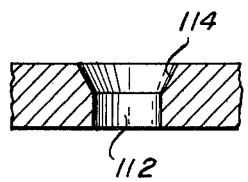

LEAD CUT AND OUTWARD CLINCH MECHANISM

In the industry of electronic component assembly and insertion, a major step comprises inserting components into circuit boards and severing the excess lead material (which was needed for handling and processing of the components up to the insertion stage) and clinching the remaining lead material to the underside of the circuit board.

Heretofor, numerous devices have been designed to accomplish the cutting and clinching function. For instance, U.S. Pat. No. 3,724,055 (Lead Cut and Outward Clinch Mechanism) provides an outwardly clinched lead. The advantage in having an outwardly clinched lead is that the component upon malfunction, may be pulled easily and separately from the circuit board and a new component inserted therefor. Inward clinching of the leads necessitates prying the leads loose with a hand tool before removing a malfunctioning component. Such an operation tends to destroy the leads of the component and surrounding connections. With outwardly biased leads, it is possible merely to insert the component into a circuit board (having a printed circuit on the bottom thereof) without the necessity of soldering the leads to the printed circuit material. Thus, with the outward clinch, the components are essentially snapped into place and may be removed simply by pulling upwardly on a component body to pull the malfunctioning component off the board for replacement by a new component.

The main advantage of an outward clinch is the excellence of in-place holding of the component, with a minimum of lead forming, and the great reduction of the danger of solder bridging from the lead to other board circuitry.

Another problem of the prior art has been the difficulty in vertical adjustment of the clinch mechanism relative to the plane of the printed circuit board. This problem is further complicated by the fact that the cutter may be required to sever different lengths of leads extending downwardly from a circuit board.

An additional problem of the prior art has been the positioning of the clinch mechanism relative to a coordinate system (for instance, an X-Y coordinate system) in the plane of the printed circuit board.

The present invention overcomes all of the disadvantages heretofor discussed and experienced in existing cut and clinch mechanisms. Generally, it consists of a vertically reciprocable spindle and attached cut and clinch head assembly. The spindle may be rotated about its longitudinal axis by an indexing rack and pinion arrangement to accommodate components placed in various orientations on the printed circuit board. After indexing, a fluid actuated lever arm raises the spindle into engagement with the underside of a printed circuit board, the limit of raising determined by a threaded bearing sleeve which is easily adjusted by a spanner wrench. Once the spindle has been raised into contact with the underside of the printed circuit board and the components have been inserted into the cut and clinch head assembly, a fluid actuated spreader rod is extended to operate the cut and clinch head assembly for cutting and then clinching of the leads. The remaining scrap lead portions are easily disposed of through a scrap shute connected to some form of collection means.

Accordingly it is an object of the present invention to provide an electronic component lead severing and outward clinching mechanism which overcomes all of the previously discussed disadvantages of the various apparatuses presently available.

It is a more specific object of this invention to provide a novel lead cut and outward clinch mechanism which is capable of severing long leads and leads of varying sizes, according to the orientation of the components to be mounted on a printed circuit board.

It is a further object of this invention to provide an electronic component lead cutting and outward clinching mechanism which is adjustable as to its initial movement and the location of its stroke.

Furthermore it is an object of this invention to provide a novel lead and outward clinch mechanism which is essentially "jam-proof" and where the severed lead portions are automatically disposed of.

These and other objects of the invention will be readily apparent during the following detailed discussion, taken with reference to the drawings, in which:

FIGS. 4 and 5 are side views of the assembled cut and clinch head assembly.

FIG. 6 is an enlarged view of the lead receiving orifice of the former arm.

DETAILED DESCRIPTION OF THE DRAWINGS

Reference is now made to one embodiment of the invention, as indicated in the attached drawings.

Figure 1:
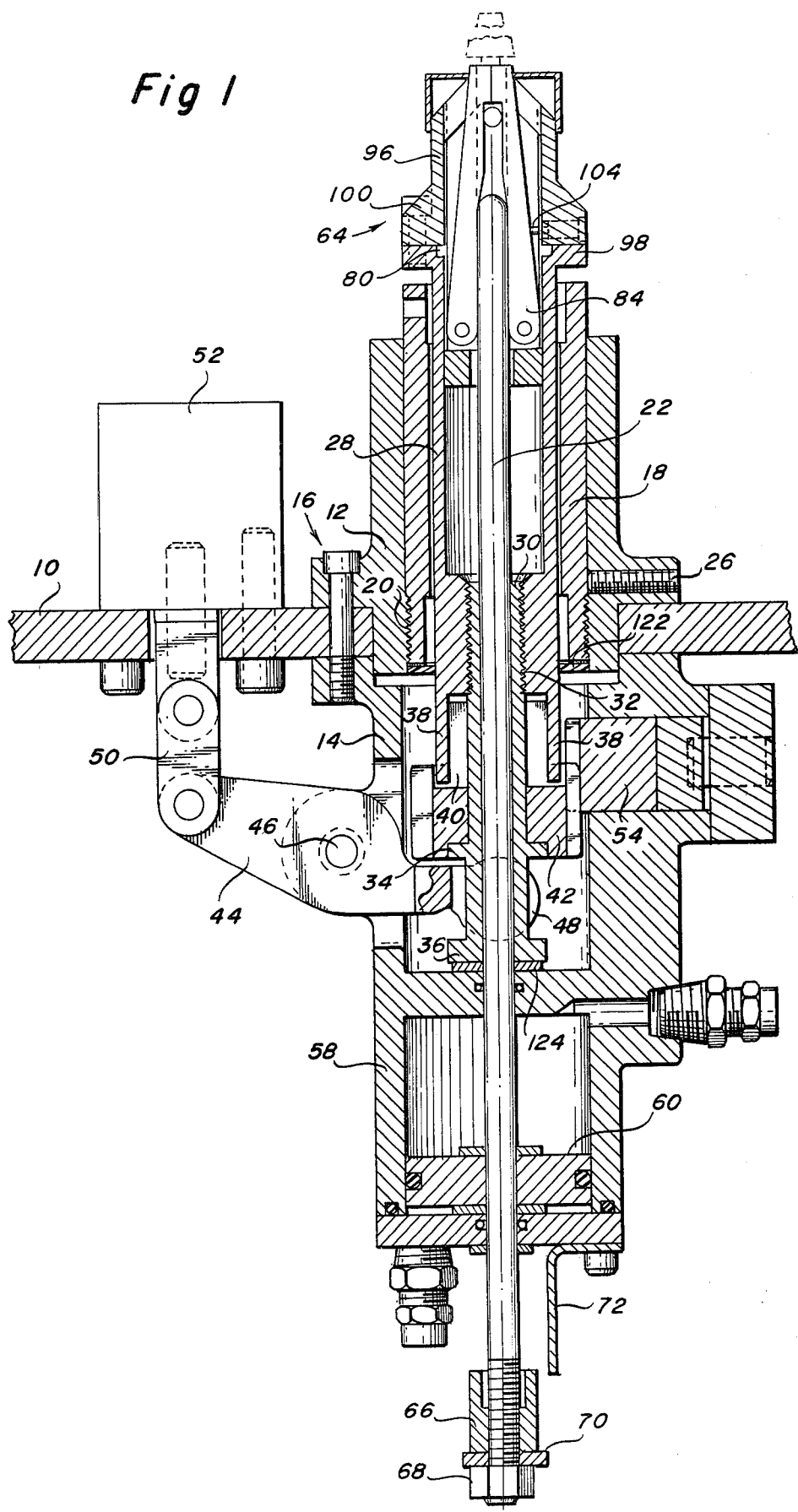
FIG. 1 is a side cross-sectional view showing the relationships of the various members.

Refering to FIG. 1, a split tubular housing 12, 14 is mounted to a support plate 10 by bolts or the like (as at 16). Within housing 12 is a bearing sleeve 18 adjustable along longitudinal axis 22 by a threaded connection 20 to housing 12. Two holes 24 are provided in sleeve 18 for insertion of a spanner wrench to make this longitudinal adjustment; a set screw 26 is provided to retain the adjusted position.

A reciprocable, rotatable spindle 28 is telescoped within bearing sleeve 18. To the inside of spindle 28 is threaded, at 32, the upper end of thrust tube 30 having circular flanges 34, 36. Below threaded connection 32, spindle 28 has two downwardly extending tangs 38 which engage in a transverse slot 40 in the top of pinion gear 42. The bottom of pinion gear 42 rests on flange 34 of thrust tube 30. In this manner of interconnection, gear 42 may be slid onto thrust tube 30 until it rests against flange 34; spindle 28 is then threaded onto thrust tube 30 until tangs 38 engage in slot 40 of gear 42, such that rotation of gear 42 will cause rotation of spindle 28.

A lever arm 44 is pivotally attached to housing 14 at 46 and has a forked end 48 extending into housing 14 and straddling thrust tube 30 (between flanges 34, 36); the other end of lever arm 44 is attached to rod 50 of a vertical positioning piston/cylinder 52 mounted on support plate 10.

Figure 2:
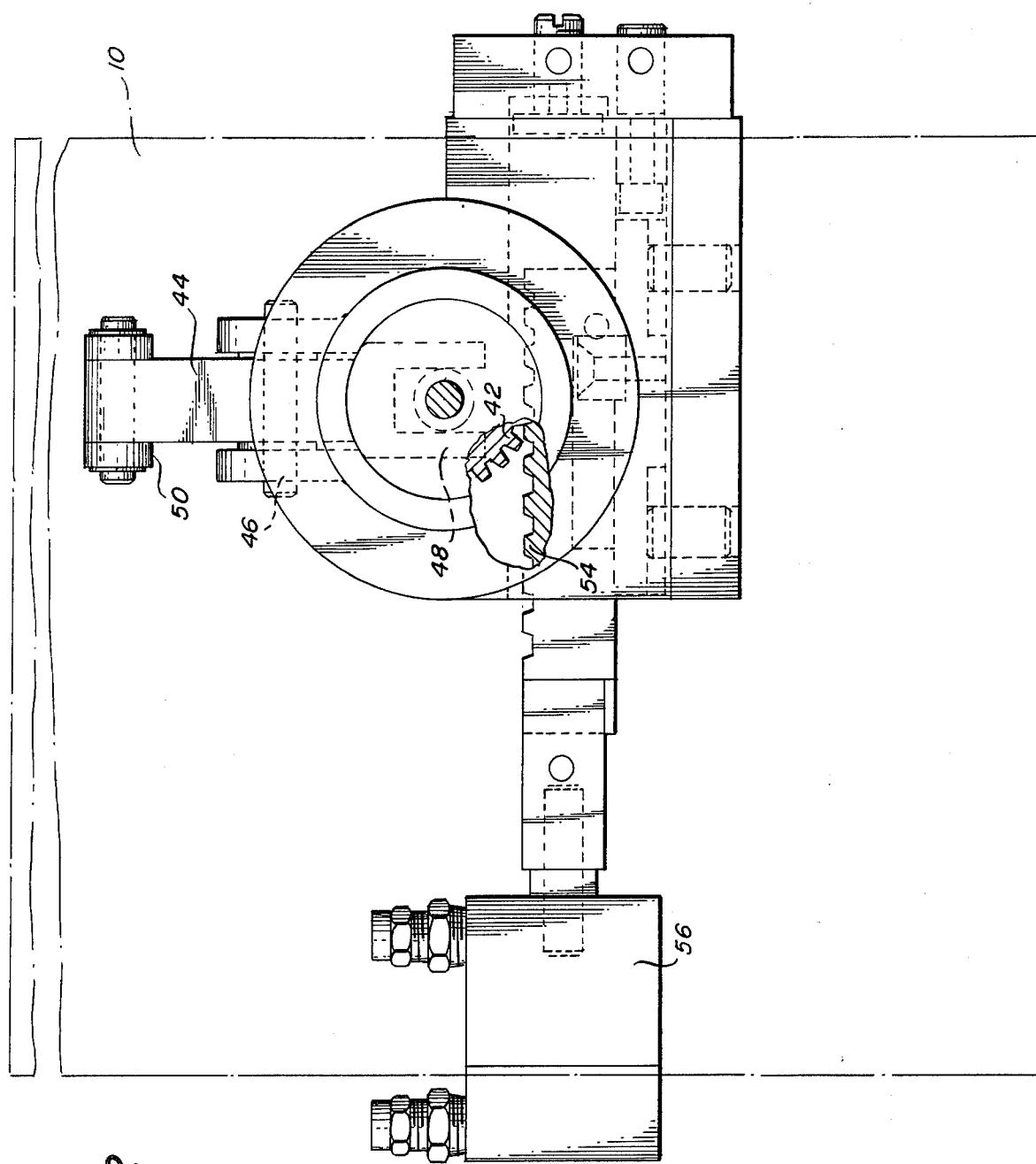
FIG. 2 is a top plan view, partially broken away, of the device shown in FIG. 1.

As best seen in FIG. 2, a rack gear 54 extends through housing 14 at right angles to longitudinal axis 22 and meshes with pinion gear 42; reciprocation of rack gear 54 is provided by indexing piston/cylinder 56.

By rack and pinion action, spindle 28 is rotated about longitudinal axis 22, with pivoting of lever arm 44 causing a reciprocation of spindle 28 along longitudinal axis 22. Spindle 28 is rotatable through 90° in this embodiment but could be rotatable through any angle.

The lower end of housing 14 includes a spreader cylinder 58 and piston 60. Pinned to piston 60 is a spreader rod 62 which extends upwardly through cylinder 58, thrust tube 30, and into engagement with a cut and clinch head assembly 64. Spreader rod 62 extends downwardly through cylinder 58 and is threaded to receive a stop collar 66 and nut 68, between which is clamped magnet support 70. Bracket 72, at the lower end of cylinder 58, supports a Hall effect switch (not shown) which is actuated by a magnet held in magnet support 70 when spreader rod 62 is extended upwardly.

Figure 3:
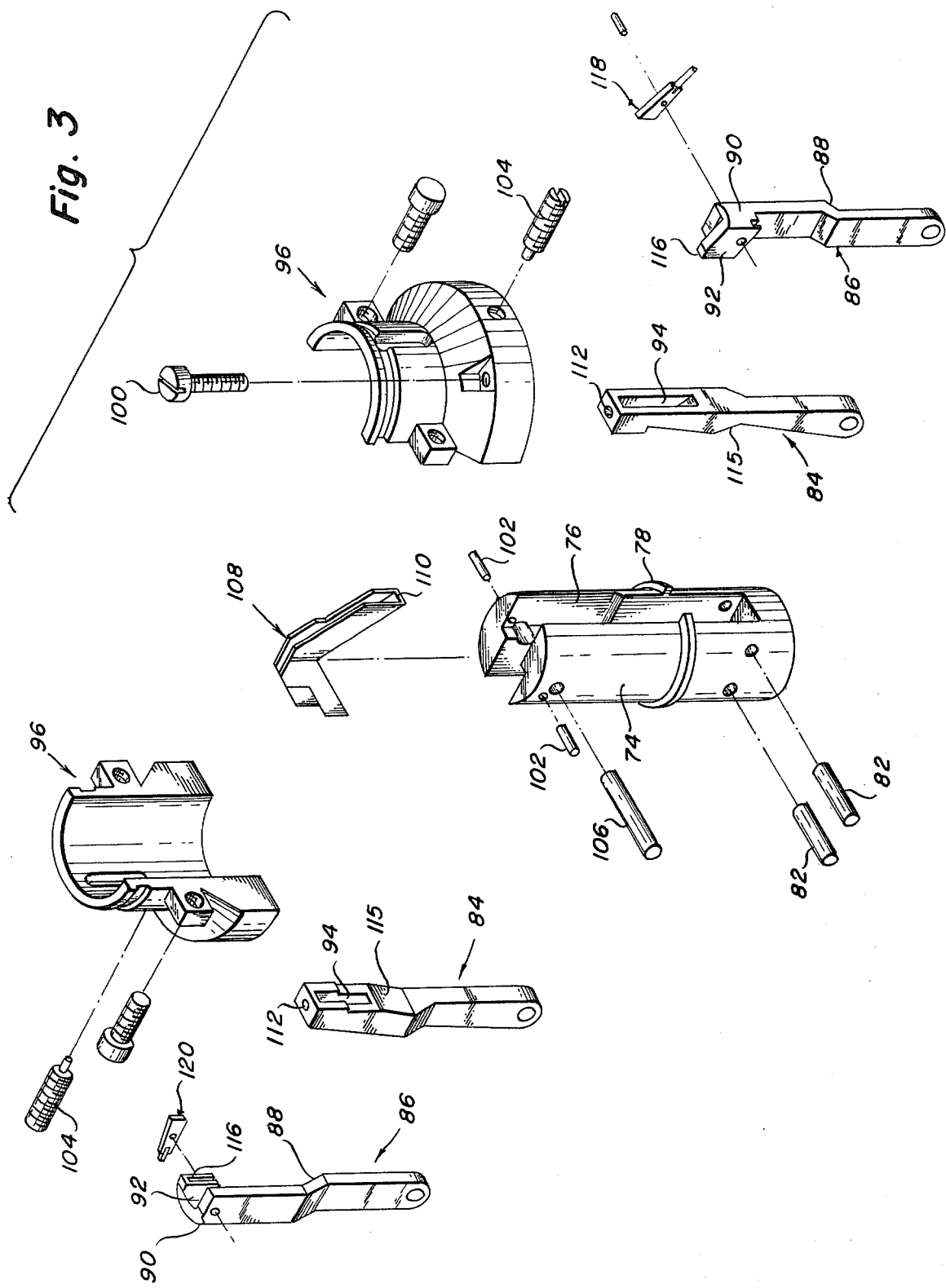
FIG. 3 is an exploded isometric view showing the details of the cut and clinch head assembly.

As best seen in the exploded isometric view of FIG. 3, head assembly 64 comprises a machined tubular body 74 with an angled slot 76 in the upper portion thereof, and a flange 78 on the outer circumference thereof. Tubular body 74 is adapted to fit into the upper end of spindle 28 with flange 78 mating within inner circular ledge 80 (FIG. 1) of spindle 28. Pivot pins 82 connect former arms 84 and cutter arms 86 to body 74; each cutter arm 86 is angled at 88 and again at 90 so that upper end 92 may be nested within slot 94 (and within a scrap chute 108) at the upper end of each former arm 84; former arm 84 may pivot relative to cutter arm 86. Cover sleeve 96 fits down over body 74 and is attached to spindle lip 98 at 100. Cover sleeve 96 prevents outward pivoting of cutter arms 86 (and thus limits outward pivoting of former arms 84); inward pivoting of cutter arms 86 is prevented by force-fit pins 102. Thus, cutter arms 86 are retained in a fixed position by pins 102 and sleeve 96 when sleeve 96 is attached to lip 98. Spring plunger 104 (for instance, Vlier S50N spring plungers, manufactured by Gierston Tool Co., Inc.) are threaded into sleeve 96 to engage and bias former arms 84 inwardly.

A Force-fit center pin 106 limits inward movement of former arms 84 and also supports scrap chute 108. Slots 94 in former arms 84 are configured so that the angled chute arms 110 of scrap chute 108 fit through them while still allowing former arms 84 to move relative to chute arms 110 and cutter arms 86.

In the top end of each former arm 84 is an orifice 112 with a conical depression at 114 (best seen in FIG. 6) for guiding reception of the leads that are to be cut and clinched when they are inserted down through holes in a printed circuit board. Former arms 84 angle inwardly at 115 for engagement by spreader rod 62; when rod 62 is extended upwardly, by actuation of spreader cylinder 58, former arms 84 are forced outwardly against the return bias of spring plungers 104. During this outward pivoting of former arms 84, the leads that protrude into orifices 112 are pushed against cutter surfaces 116 of respective cutter arms 86 in a shearing action. The portion of each lead that is sheared off then falls down chute arm 110 to a collector (not shown). The portion of each lead that still remains attached to a component is caused to bend upwardly out of orifice 112 and be clinched outwardly against the bottom surface of the printed circuit board (nominally, at a minimum angle of 60° to the bottom of the printed circuit board).

A lead detector 118, attached to each cutter arm 86, is insulated from the cutter arm 86 and has bare contact surface 120 for engagement by a component lead during the shearing action. During this shearing action, the lead completes a series circuit (through former arm 84 and contact surface 120) to detect lead presence. If a lead doesn't contact surface 120, an indication is made to the machine control, or to an operator, that an improper cut and clinch has occurred.

Urethane bumpers 122, 124, 126, and 128 are provided to absorb shock and to reduce noise.

At the commencement of a cut and clinch cycle, the spindle 28 (and therefore the head 64) is oriented about longitudinal axis 22 according to the orientation of the component to be inserted into the printed circuit board. A control means (not shown) determines whether the indexing piston/cylinder 56 should be changed from its present status (i.e., 0° or 90°), and any required indexing is completed under command. Vertical positioning piston/cylinder 52 then is actuated to raise spindle 28 and engage the top of the former arms 84 with the underside of a printed circuit board such that the leads to be cut and clinched extend into orifices 112. Then, upon command, spreader cylinder 58 is fired to cause spreading of former arms 84 by spreader rod 62, so that the leads are cut (with detection of the presence of a lead in each orifice 112) and clinched outwardly to the underside of the printed circuit board. During the clinching of the leads, the printed circuit board is caused to bow very slightly, thus allowing the leads to raise out of orifice 112 during clinching to the underside of the surface of the printed circuit board. When spreader rod 62 has extended a set amount, a Hall effect switch is actuated to tell the control that clinch is complete, whereupon the spindle is retracted and the mechanism awaits a command for the next cycle.

While only one embodiment of the invention has been shown and described, it is obvious that many changes and modifications will be apparent to those of ordinary skill in the art without departing from the scope of the appended claims.

It will thus be seen that the objects set forth above, among those made apparent from the preceeding description, are efficiently attained and, since certain changes may be made in carrying out the above method and in the construction set forth without departing from the scope of the invention, it is intended that all matter contained in the above description or shown in the accompanying drawings should be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed as new and is desired to be secured by Letters Patent is:

1. An apparatus for shearing the ends of the component leads projecting through a circuit board and clinching the remaining portions to the underside of said circuit board, and comprising:

a spindle reciprocatable along and pivotal about a longitudinal axis;

a head assembly mounted to said spindle and comprising pivotal former means and immobilized cutter means for cooperating with said pivotal former means and shearing said ends, said former means for guiding and receiving said leads into said head assembly and for moving said leads into shearing engagement with said cutter means and for clinching said remaining portions;

means for attaching said former means and said cutter means to said head assembly on a common axis generally perpendicular to said longitudinal axis;

cover means removeably attached to said spindle for substantially enclosing said head assembly and said spindle and limiting the ingress of foreign objects thereto and immobilizing said cutter means;

adjustable bias means attached to said cover means for adjustably biasing said former means away from said cutter means;

spreader means reciprocatable along said longitudinal axis relative to said spindle for engaging said former means and actuating said shearing and clinching against the biasing of said bias means;

detector means for engaging said leads during said shearing and for detecting the presence and absence of said leads;

a scrap removal means in said head assembly for receiving said sheared ends and evacuating them out of said head assembly;

a tubular housing telescopically receiving an adjustable bearing means for telescopically receiving said spindle and adjusting upper and lower limits of reciprocation of said spindle;

indexing means for rotating said spindle about said longitudinal axis and orienting said former means for reception of said leads; and means for actuating said index means, reciprocating said spindle, and reciprocating said spreader means, upon command.

2. An apparatus for cutting and clinching the component leads projecting beneath a circuit board, said apparatus comprising:

a spindle reciprocatable along an axis;

a head assembly mounted to said spindle, and comprising pivotal former means and immobilized cutter means for cooperating with said pivotal former means and shearing ends of said leads, said former means for moving said leads into engagement with and across said cutter means for said shearing and clinching;

cover means removeably attached to said spindle for substantially enclosing said head assembly and said spindle for limiting the ingress of foreign objects thereto and immobilizing said cutter means;

lead receiving means in said former means for receiving and guiding said leads into said former means prior to said shearing and for guiding said remaining portions of said leads out of said former means during said clinching; and reciprocatable spreader means for reciprocating along said axis relative to said spindle and actuating said former means.

3. An apparatus as in claim 2, wherein said apparatus further comprises:

a tubular housing;

a bearing sleeve adjustable relative to said housing and telescopically receiving said spindle, said bearing sleeve defining upper and lower limits of reciprocation of said spindle;

whereby limits of vertical reciprocation of said spindle relative to said circuit board are set by adjustment of said bearing sleeve relative to said housing.

4. An apparatus as in claim 2, wherein said apparatus further comprises:

a sensing means for sensing the vertical position of said spreader means.

5. An apparatus as in claim 2, wherein said apparatus further comprises:

a scrap chute in said head assembly for receiving sheared ends of said leads and evacuating them away from said head assembly.

6. An apparatus as in claim 2, wherein said head assembly further comprises:

detection means for detecting the presence and absence of said leads during said shearing.

7. An apparatus as in claim 2, and further comprising:

indexing means for rotating said spindle about said vertical axis and positioning said lead receiving means for reception of said leads, upon command.

* * * * *